(12) United States Patent
Sugiura et al.

(10) Patent No.: US 8,829,580 B2
(45) Date of Patent: Sep. 9, 2014

(54) MAGNETORESISTIVE MEMORY AND MANUFACTURING METHOD

(75) Inventors: Kuniaki Sugiura, Fujisawa (JP); Yoshiaki Asao, Kawasaki (JP); Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 12/854,724

(22) Filed: Aug. 11, 2010

(65) Prior Publication Data

US 2011/0037108 A1   Feb. 17, 2011

(30) Foreign Application Priority Data

Aug. 11, 2009  (JP) ................................ 2009-186782

(51) Int. Cl.
*H01L 29/82* (2006.01)
(52) U.S. Cl.
USPC .......................................... 257/295; 365/158
(58) Field of Classification Search
USPC ...................... 257/2–4, 295, E29.323; 438/3
See application file for complete search history.

(56) References Cited

U.S. PATENT DOCUMENTS

| | | | |
|---|---|---|---|
| 6,930,910 B2 * | 8/2005 | Oh et al. ......................... | 365/158 |
| 6,965,138 B2 * | 11/2005 | Nakajima et al. ............. | 257/295 |
| 7,291,506 B2 | 11/2007 | Nakajima et al. | |
| 7,399,646 B2 | 7/2008 | Kanakasabapathy et al. | |
| 7,931,976 B2 | 4/2011 | Ohsawa et al. | |
| 2002/0044481 A1* | 4/2002 | Hidaka ......................... | 365/158 |

FOREIGN PATENT DOCUMENTS

| | | |
|---|---|---|
| JP | 2004-55918 | 2/2004 |
| JP | 2004-146614 | 5/2004 |
| JP | 2005-044848 | 2/2005 |
| JP | 2009-506531 | 2/2009 |
| JP | 2009-094244 | 4/2009 |

OTHER PUBLICATIONS

Office Action mailed on Jan. 17, 2012 in corresponding Japanese Application No. JP 2009-186782.

* cited by examiner

*Primary Examiner* — Howard Weiss
*Assistant Examiner* — Sue Tang
(74) *Attorney, Agent, or Firm* — Knobbe Martens Olson & Bear LLP

(57) ABSTRACT

According to one embodiment, a magnetoresistive memory includes first and second contact plugs in a first interlayer insulating film, a lower electrode on the first interlayer insulating film, a magnetoresistive effect element on the lower electrode, and an upper electrode on the magnetoresistive effect element. The lower electrode has a tapered cross-sectional shape in which a dimension of a bottom surface of the lower electrode is longer than a dimension of an upper surface of the lower electrode, one end of the lower electrode is in contact with an upper surface of the first contact plug. The magnetoresistive effect element is provided at a position shifted from a position immediately above the first contact plug in a direction parallel to a surface of the semiconductor substrate.

6 Claims, 9 Drawing Sheets

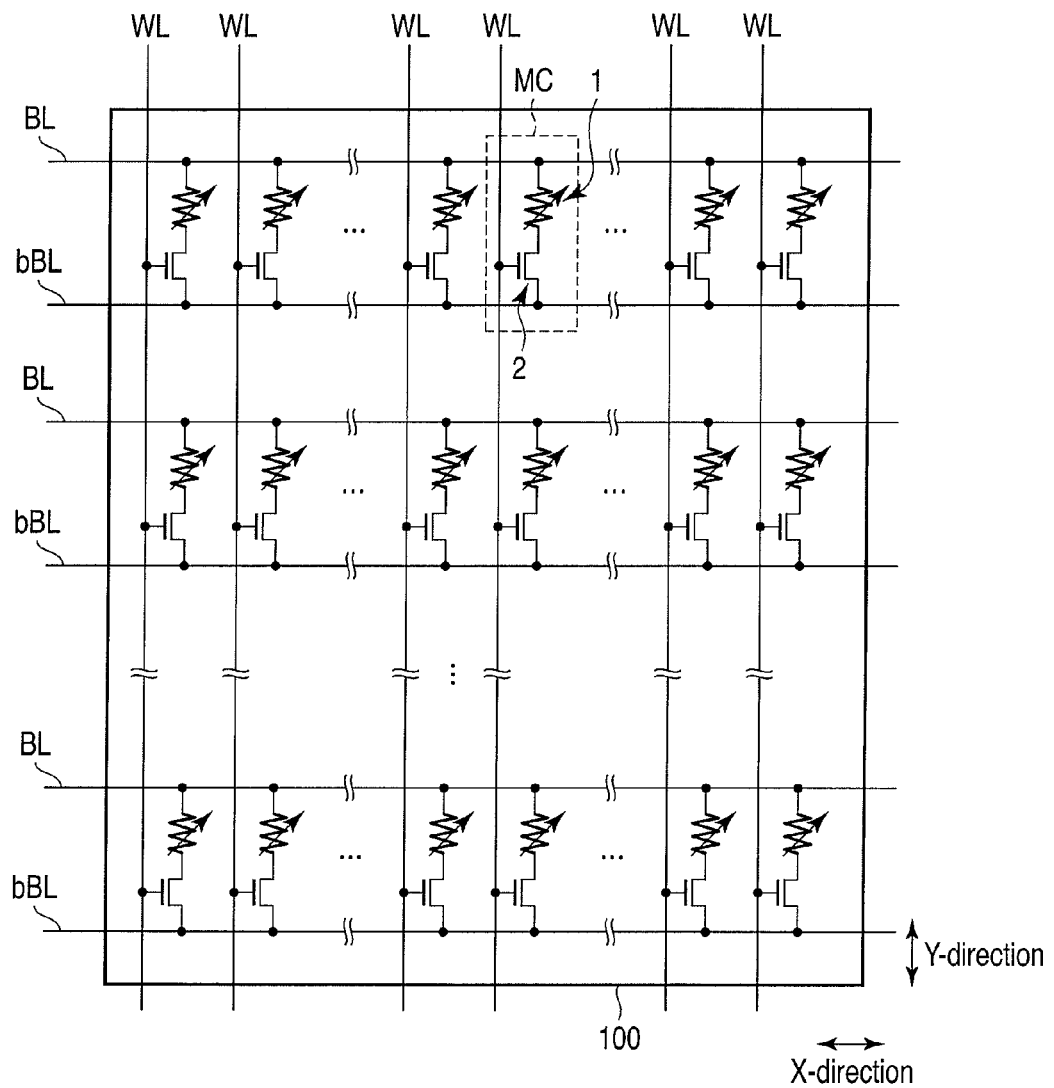
F I G. 1

Thickness 50nm

Thickness 100nm

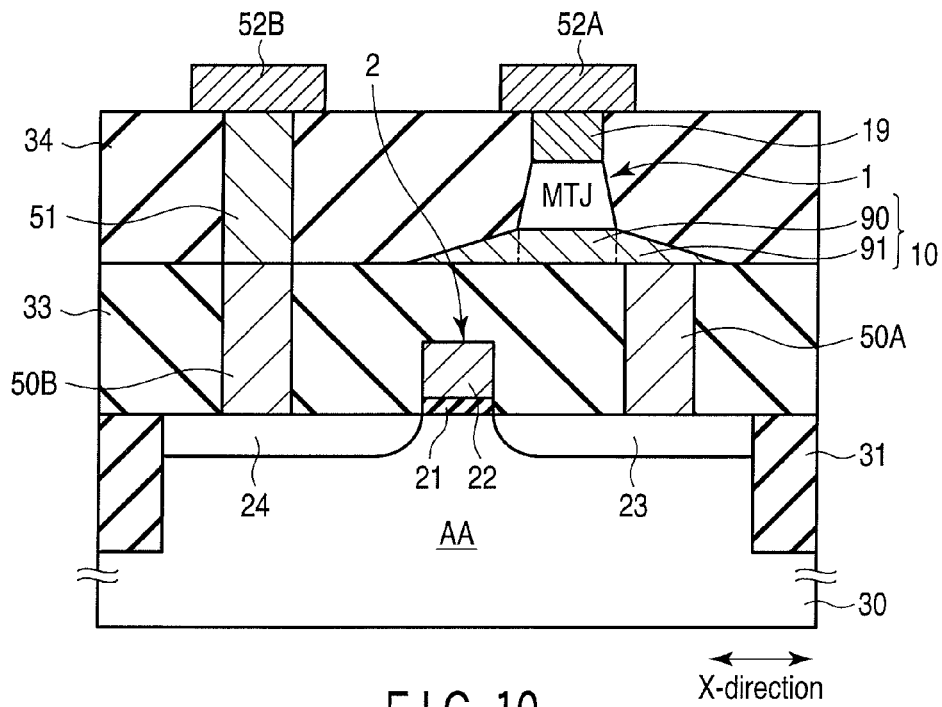
F I G. 10
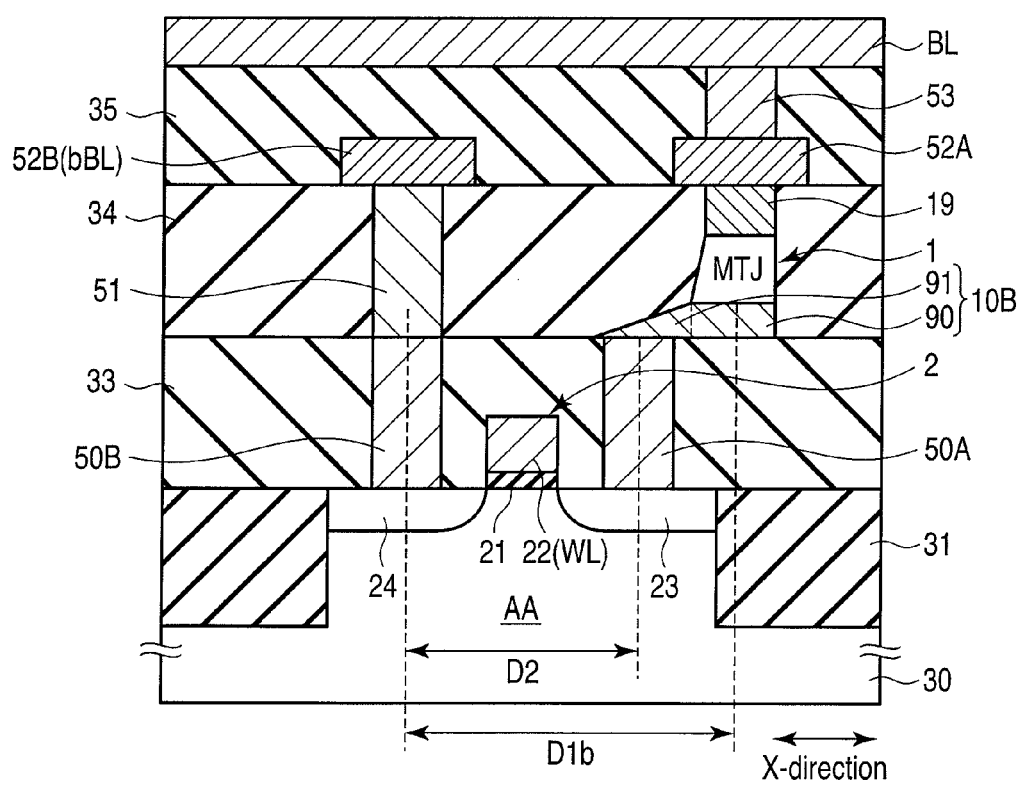
F I G. 11

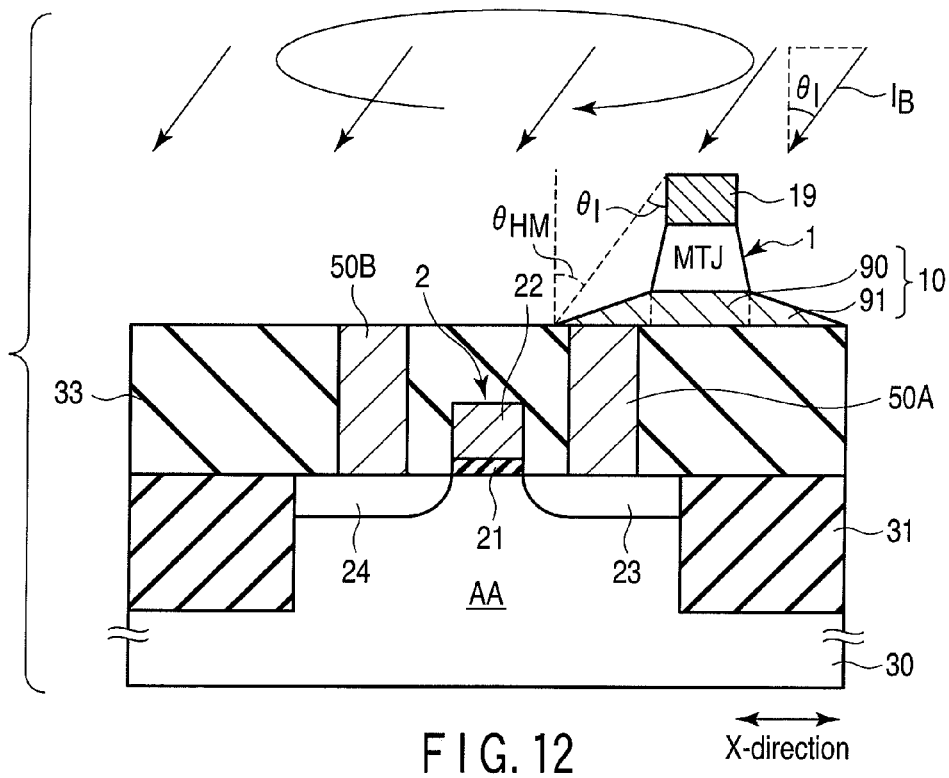
F I G. 12
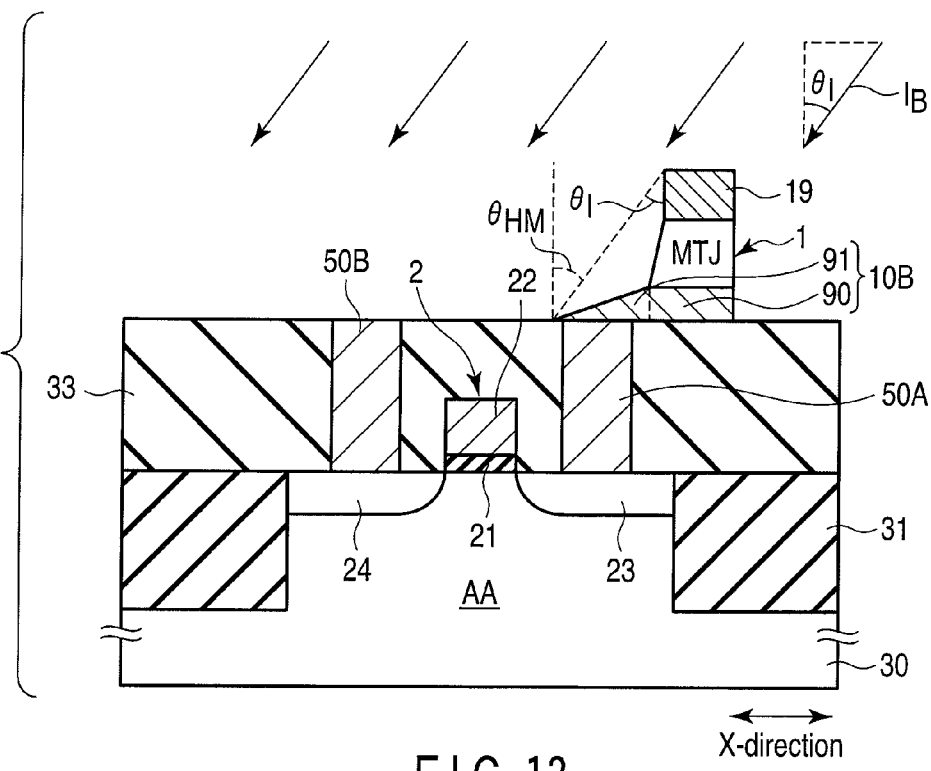
F I G. 13

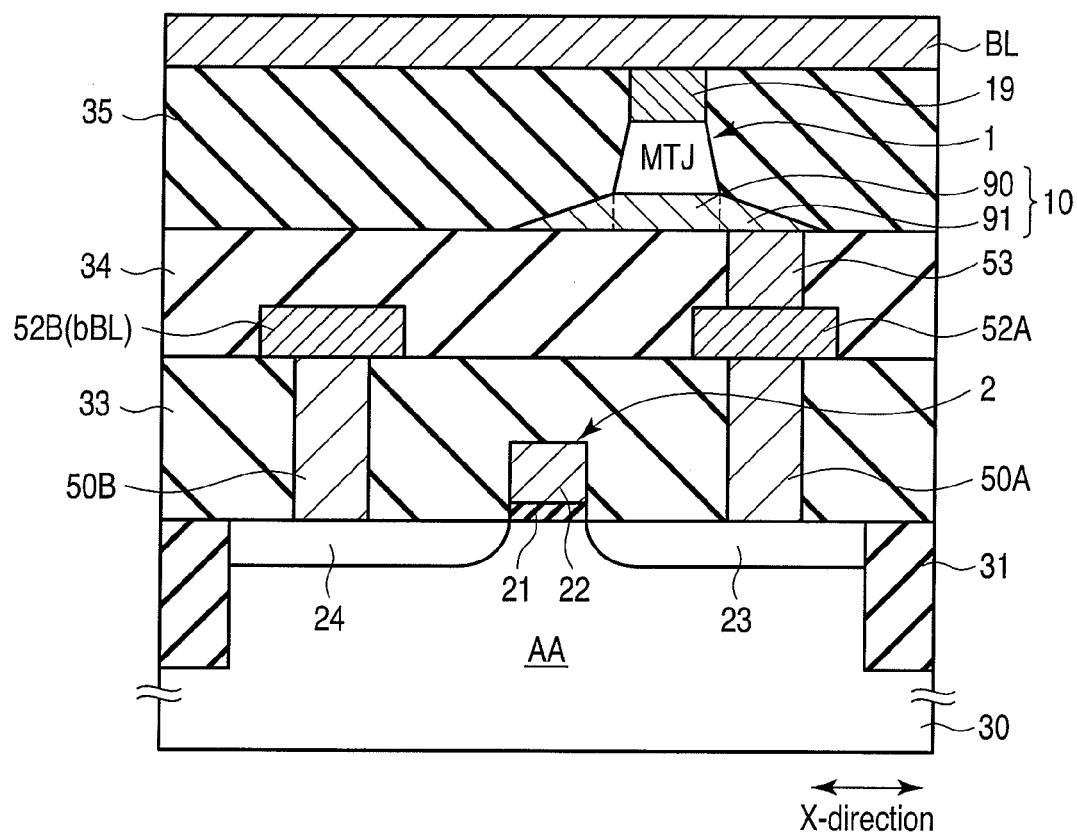
F I G. 14

MAGNETORESISTIVE MEMORY AND MANUFACTURING METHOD

CROSS-REFERENCE TO RELATED APPLICATIONS

This application is based upon and claims the benefit of priority from Japanese Patent Application No. 2009-186782, filed Aug. 11, 2009; the entire contents of which are incorporated herein by reference.

FIELD

Embodiments described herein relates generally to a magnetoresistive memory and a manufacturing method thereof.

BACKGROUND

As one type of magnetic resistive memory, there is a magnetoresistive random access memory (MRAM). The magnetoresistive random access memory is a memory that stores data by utilizing the fact that a resistance value of a magnetoresistive effect element changes owing to a change in relative relationship in the magnetizing directions of two ferromagnetic layers of the magnetoresistive effect element.

A memory cell in the magnetoresistive random access memory has a magnetoresistive effect element in which a plurality of ferromagnetic layers and a nonmagnetic layer are laminated, and a field-effect transistor that functions as a selecting switch (which will be referred to as a select transistor hereinafter). The magnetoresistive effect element includes a ferromagnetic layer having an invariable magnetizing direction (which will be referred to as a magnetization invariable layer or a reference layer hereinafter), a ferromagnetic layer having a variable magnetizing direction (which will be referred to as a magnetization free layer or a storage layer hereinafter), and a nonmagnetic layer sandwiched between these ferromagnetic layers. Thus, data is written by changing the magnetizing direction of the magnetization free layer.

In general, the select transistor is arranged on a semiconductor substrate, and the magnetoresistive effect element is arranged in an interconnect level above the select transistor through an interlayer insulating film. To connect the select transistor with the magnetoresistive effect element, a contact plug buried in the interlayer insulating film is used.

For example, the magnetoresistive effect element is arranged immediately above the contact plug through a lower electrode. A crystal structure of a metal of the contact plug is usually different from a crystal structure of a magnetic layer. Therefore, when the lower electrode cannot buffer a difference in crystal structure between the contact plug and the magnetic layer, there is a concern that crystallinity of the contact plug affects crystallinity of the magnetic layer. Characteristics of the magnetoresistive effect element are largely dependent on the crystallinity of the magnetic layer of the element. Therefore, when the crystallinity of the magnetic layer is affected by the crystallinity of the contact plug, element characteristics are degraded.

Further, as a method of avoiding adverse affect of the crystallinity of the contact plug with respect to the magnetoresistive effect element, the magnetoresistive effect element may be shifted in a parallel direction from a position immediately above the contact plug for the rearrangement of the element in some cases (see, e.g., JP-A 2005-44848 (KOKAI)). In this case, a step of processing the magnetoresistive effect element and a step of processing the lower electrode by using a photolithography technology and an etching technology are separately executed, with the result that the number of manufacturing steps increases and a manufacturing cost accordingly increases.

BRIEF DESCRIPTION OF THE DRAWINGS

FIG. 1 is an equivalent circuit diagram showing a structural example of a memory cell array of a magnetoresistive random access memory;

FIG. 10 is a view showing one step in the manufacturing method of the magnetoresistive random access memory according to the first embodiment;

FIG. 11 is a cross-sectional view showing a configuration of a magnetoresistive random access memory according to a second embodiment;

FIG. 12 is a view showing one step in a manufacturing method of the magnetoresistive random access memory according to the second embodiment;

FIG. 13 is a view showing one step in the manufacturing method of the magnetoresistive random access memory according to the second embodiment; and FIG. 14 is a view showing a modification of the magnetoresistive random access memory according to this embodiment.

DETAILED DESCRIPTION

Figure 2:
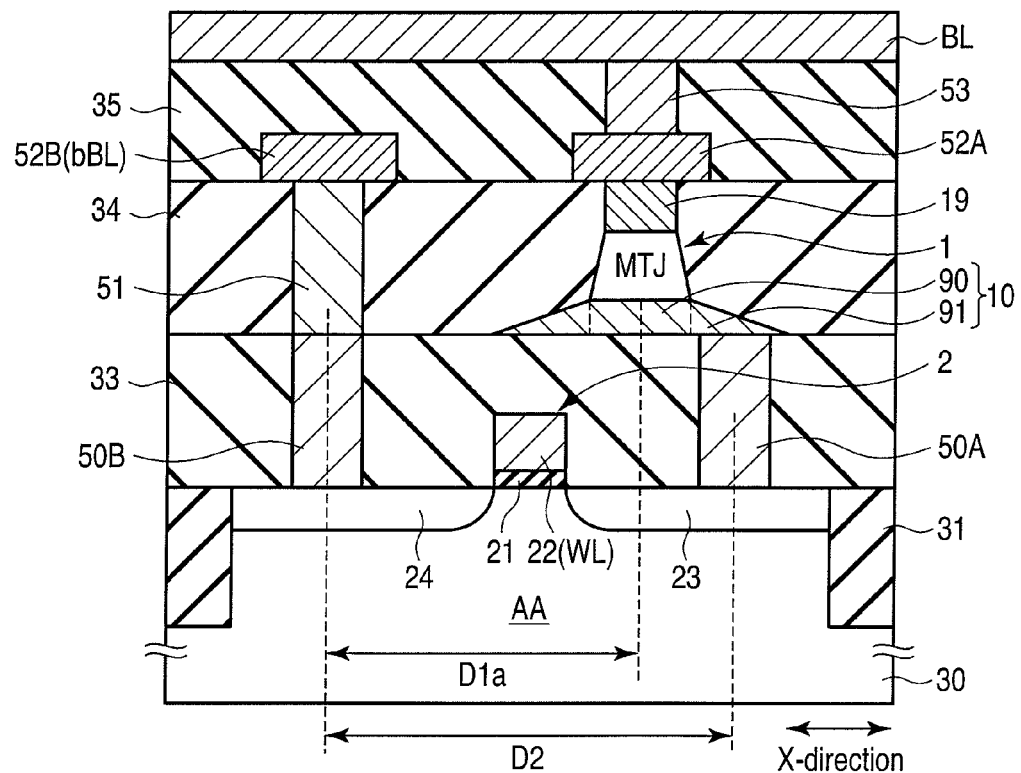
FIG. 2 is a cross-sectional view showing a configuration of a magnetoresistive random access memory according to a first embodiment.

This embodiment will now be described hereinafter in detail with reference to the accompanying drawings.

In general, according to one embodiment, a magnetoresistive memory includes first and second contact plugs in a first interlayer insulating film on a semiconductor substrate, a lower electrode on the first interlayer insulating film, a magnetoresistive effect element on the lower electrode, and an upper electrode on the magnetoresistive effect element. The magnetoresistive effect element includes a first magnetic layer having an invariable magnetizing direction, a second magnetic layer having a variable magnetizing direction, and an intermediate layer between the first and second magnetic layers. The lower electrode has a tapered cross-sectional shape in which a dimension of a bottom surface of the lower electrode is longer than a dimension of an upper surface of the lower electrode, one end of the lower electrode is in contact with an upper surface of the first contact plug. The magnetoresistive effect element is provided at a position shifted from a position immediately above the first contact plug in a direction parallel to a surface of the semiconductor substrate.

A magnetoresistive random access memory will be explained as an example of a magnetoresistive memory hereinafter.

EMBODIMENTS

(1) First Embodiment

A magnetoresistive random access memory according to a first embodiment will now be described hereinafter with reference to FIGS. 1 to 10.

(a) Configuration

A configuration of the magnetoresistive random access memory according to the first embodiment will now be described with reference to FIGS. 1 to 5B.

FIG. 1 shows an equivalent circuit of a memory cell array 100 of the magnetoresistive random access memory.

In the memory cell array 100, a plurality of bit lines BL and bBL extending in an X-direction and a plurality of word lines WL extending in a Y-direction are provided. One word line WL and two bit lines BL and bBL are connected to one memory cell MC. The two bit lines BL and bBL form one pair of bit lines.

In the memory cell array 100, the plurality of memory cells MC are arranged in an array form. The plurality of memory cells MC aligned in the X-direction are connected to one pair of bit lines BL and bBL in common. Further, the plurality of memory cells MC aligned in the Y-direction are connected with one word line WL in common.

Each of the memory cells MC includes one magnetoresistive effect element 1 and one selecting switch element 2. The selecting switch element 2 is, e.g., a field-effect transistor. The selecting switch element 2 will be referred to as a select transistor 2 hereinafter.

One end (a first terminal) of the magnetoresistive effect element 1 is connected with the bit line BL forming the bit line pair. The other (a second terminal) end of the magnetoresistive effect element 1 is connected with one end of a current path (a source/drain) of the select transistor 2). The other end of the current path (the source/drain) of the select transistor 2 is connected with the other bit line bBL forming the bit line pair. A control terminal (a gate) of the select transistor 2 is connected with the word line WL.

The magnetoresistive effect element 1 takes two steady states that magnetizing directions of two ferromagnetic layers become parallel or anti-parallel, and a resistance value of the element 1 varies in accordance with the two steady states. In the magnetoresistive effect element 1, when one of the two steady states is associated with data "0" and the other is associated with data "1", 2-level (binary) data is stored in the memory cell MC.

A configuration of the memory cell of the magnetoresistive random access memory according to this embodiment will now be described with reference to FIG. 2.

FIG. 2 is a cross-sectional view showing a configuration of one memory cell MC. FIG. 2 shows a cross section of the configuration of the memory cell MC in an extending direction of the bit lines (the X-direction).

An element isolation insulating film 31 is buried in a semiconductor substrate 30, and this element isolation insulating film 31 partitions an element forming region (a semiconductor region) AA.

The select transistor 2 is provided in the element forming region AA. In the semiconductor substrate 30 as the element forming region AA, two diffusion layers (first and second diffusion layers) 23 ad 24 are provided. The two diffusion layers 23 and 24 serve as source/drain regions of the transistor 2. A gate insulating film 21 is provided on a surface of the semiconductor substrate (a channel region) 30 between the two diffusion layers (which will be referred to as source/drain diffusion layers hereinafter) 23 and 24. A gate electrode 22 is provided on a gate insulating film 21. A gate electrode 22 extends in the Y-direction, and it is shared by the plurality select transistors 2 aligned in the Y-direction. The gate electrode functions as the word line WL.

Contact plugs 50A and 50B are provided on the source/drain diffusion layers 23 and 24. The contact plugs 50A and 50B are buried in a first interlayer insulating film 33 that covers the surface of the semiconductor substrate 30.

A lower electrode 10 is provided on the interlayer insulating film 33. The magnetoresistive effect element 1 is provided on the lower electrode 10. Furthermore, an upper electrode 19 is provided on the magnetoresistive effect element 1.

The magnetoresistive effect element 1 is provided at a position shifted from a position immediately above the contact plug 50A in a direction parallel to the surface of the semiconductor substrate 30. The magnetoresistive effect element 1 is arranged to shift toward the contact plug 50B side. For example, the magnetoresistive effect element 1 is arranged above the gate electrode 22 of the select transistor 2 or above a region (the diffusion layer 23) between the gate electrode 22 and the contact plug 50A via the lower electrode 10 and the interlayer insulating film 33. Moreover, the magnetoresistive effect element 1 may be arranged above a region (the diffusion layer 24) between the gate electrode 22 and the contact plug 50B.

One end of the lower electrode 10 is in contact with the contact plug 50A. The magnetoresistive effect element 1 is electrically connected with the source/drain diffusion layer 23 of the select transistor 2 via the lower electrode 10 and the contact plug 50A. As a result, one end of the magnetoresistive effect element 1 is connected with one end (the source/drain) of the current path of the select transistor 2.

The magnetoresistive effect element 1 and the lower/upper electrodes 10 and 19 are covered with a second interlayer insulating film 34. The first bit line BL extending in the X-direction is provided above the magnetoresistive effect element 1 through a third interlayer insulating film 35. The bit line BL is connected with the upper electrode 19 through an intermediate interconnect 52A and a via plug 53 provided in the interlayer insulating film 35. As a result, the other end of the magnetoresistive effect element 1 is connected with the bit line BL.

In the interlayer insulating film 34, a via plug 51 is provided to be adjacent to the X-direction of magnetoresistive effect element 1. The via plug 51 is provided on the contact plug 50B. In the interlayer insulating film 35, an interconnect 52B is provided. The interconnect 52B is drawn out in a front or depth direction in FIG. 2 and functions as, e.g., the second bit line bBL that forms a pair with the first bit line. However, the interconnect 52B may be an intermediate interconnect connected with the second bit line bBL.

The interconnect 52B is electrically connected with the source/drain diffusion layer 24 of the select transistor 2 via the two plugs 50B and 51. As a result, the other end (the source/drain) of the current path of the select transistor 2 is connected with the bit line bBL.

Figure 3:
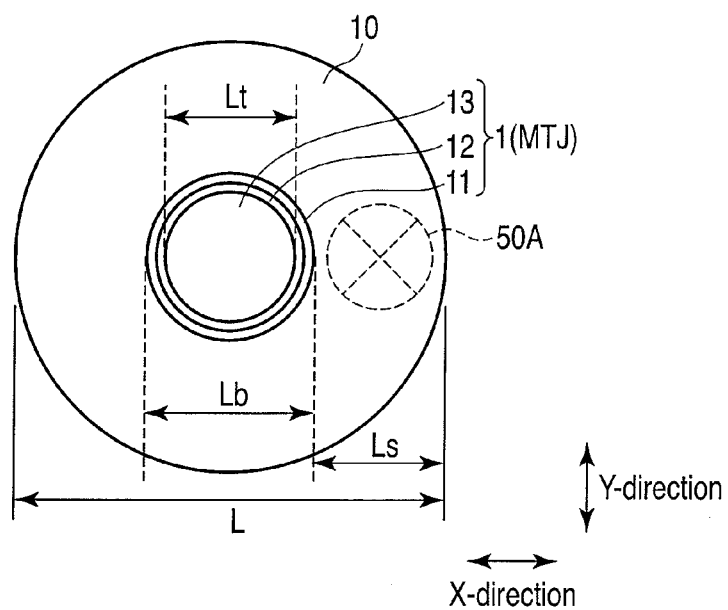
FIG. 3 is a plan view showing an example of a configuration of a magnetoresistive effect element.

The configuration of the magnetoresistive effect element 1 will now be described with reference to FIG. 3, FIG. 4A and FIG. 4B. FIG. 3 shows a planar configuration of the magnetoresistive effect element 1. Additionally, each of FIG. 4A and FIG. 4B shows a structural example of the magnetoresistive effect element 1.

As shown in FIG. 3, each of the magnetoresistive effect element 1 and the two electrodes 10 and 19 has a planar shape of a circular shape, an elliptic shape or a shape close to a circle.

Figure 4A:
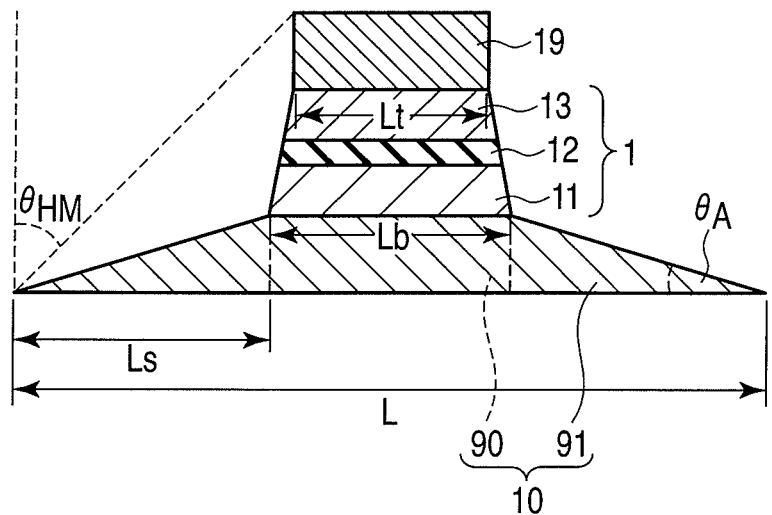
FIG. 4A is a cross-sectional view showing an example of the configuration of the magnetoresistive effect element.
Figure 4B:
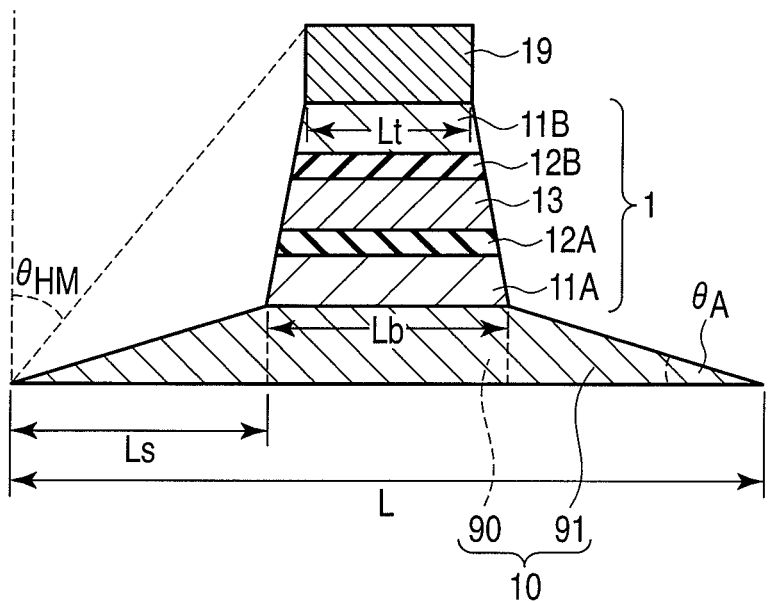
FIG. 4B is a cross-sectional view showing an example of the configuration of the magnetoresistive effect element.

As shown in FIG. 4A, the magnetoresistive effect element 1 has a laminated structure in which a first ferromagnetic layer (which will be referred to as a reference layer hereinafter) 11, an intermediate layer 12 and a second ferromagnetic layer (which will be referred to as a storage layer hereinafter) 13 are sequentially laminated. It is to be noted that a lamination order of the reference layer 11 and the storage layer 13 may be reversed. As described above, the magnetoresistive effect element 1 used for the magnetoresistive random access memory is an element having the laminated structure in which the intermediate layer 12 is sandwiched between the two ferromagnetic layers 11 and 13, and it is an MTJ (magnetic tunnel junction) element utilizing a change in magnetic resistance due to a spin polarization tunnel effect. The magnetoresistive effect element 1 will be referred to as an MTJ element 1 hereinafter.

The storage layer 13 has a variable magnetizing (or spin) direction, and this magnetizing direction can be inverted. The reference layer 11 has an invariable magnetizing direction, and this magnetizing direction is fixed in one direction. The phrase "the reference layer 11 has an invariable magnetizing direction" means that the magnetizing direction of the reference layer 11 does not change when a magnetization reversal current that is used for reversing the magnetizing direction of the storage layer 13 is flowed through the reference layer 11. Therefore, in the MTJ element 1, when a magnetic layer having a large magnetization reversal current is used as the reference layer 11 and a magnetic layer having a reversal current smaller than that of the reference layer 11 is used as the storage layer 13, the MTJ element 1 including the storage layer 13 having the variable magnetizing direction and the reference layer 11 having the invariable magnetizing direction can be realized.

When spin polarization electrons cause magnetization reversal, its magnetization reversal current is proportionate to a damping constant, an anisotropy field and a volume of the magnetic layer, and hence appropriately adjusting these elements enables providing a difference between the magnetization reversal currents of the storage layer 13 and the reference layer 11. Further, as a method of fixing magnetization of the reference layer 11, an antiferromagnetic layer (not shown) may be provided to be adjacent to the reference layer 11 and the magnetizing direction of the reference layer 11 may be fixed by exchange coupling of the reference layer 11 and the antiferromagnetic layer.

An easy magnetizing direction of each of the reference layer 11 and the storage layer 13 may be perpendicular to a film surface (or a lamination plane) (which will be referred to as perpendicular magnetization hereinafter) or may be parallel to the film surface (which will be referred to as in-plane magnetization hereinafter). The magnetic layer having the perpendicular magnetization has magnetic anisotropy in a direction perpendicular to the film surface, and the magnetic layer having the in-plane magnetization has magnetic anisotropy in an in-plane direction. When the MTJ element 1 is of a perpendicular magnetic type, a shape of the element 1 (e.g., a planar shape) does not have to be controlled to determine the magnetizing direction as different from the in-plane magnetic type element 1, and hence there is an advantage that the perpendicular magnetic type is suitable for miniaturization of the element.

It is preferable for each of the reference layer 11 and the storage layer 13 to be formed of a magnetic material having high coercive force and specifically to have a high magnetic anisotropy energy density of $1 \times 10^6$ erg/cc or above. The intermediate layer 13 is formed of, e.g., a nonmagnetic material, and an insulator, a semiconductor or a metal is used. When an insulator or a semiconductor is used for the intermediate layer 13, this layer is called a tunnel barrier layer.

It is to be noted that each of the reference layer 11 and the storage layer 13 is not restricted to such a single layer as depicted in the drawing, and it may have a laminated structure including a plurality of ferromagnetic layers. Further, each of the reference layer 11 and the storage layer 13 may have an antiferromagnetic coupling structure which includes three layers, i.e., a ferromagnetic layer, a nonmagnetic layer and a ferromagnetic layer and in which magnetic coupling (exchange coupling) is performed in such a manner that magnetizing directions of the two ferromagnetic layers can enter an antiparallel state, or it may have a ferromagnetic coupling structure in which magnetic coupling (exchange coupling) is carried out in such a manner that the magnetizing directions of the two ferromagnetic layers can enter a parallel state.

As shown in FIG. 3, the MTJ element 1 is provided at a position where it does not vertically overlap the contact plug 50A.

The MTJ element 1 has, e.g., a tapered cross-sectional shape. A length Lb of a bottom surface of the MTJ element 1 (the magnetic layer 11) is longer than a length Lt of an upper surface of the MTJ element 1 (the magnetic layer 13). The length Lb of the bottom surface of the MTJ element 1 is substantially equal to a length of an upper surface of the lower electrode 10. Furthermore, the length Lt of the upper surface of the MTJ element 1 is substantially equal to a length of a bottom surface of the upper electrode 19.

The lower electrode 10 has a tapered cross-sectional shape, and a length L of the bottom surface of the lower electrode 10 is longer than the length Lb of the upper surface of the lower electrode 10. An angle formed by a side surface of the lower electrode 10 with respect to the bottom surface of the same is an acute angle, and the lower electrode 10 has a predetermined tapered angle $\theta_A$. The lower electrode 10 covers, e.g., an upper surface of the contact plug 50A.

The upper electrode 19 functions as a hard mask that is utilized to process the MTJ element 1 and the lower electrode 10.

As shown in FIG. 3 and FIG. 4A, the lower electrode 10 spreads from the end portion of the bottom surface of the MTJ element 1 (the reference layer 11). The portion of the lower electrode 10 that spreads from the end portion of the MTJ element 1 will be referred to as a skirt portion (a second portion) 91 hereinafter. Furthermore, a length Ls of the skirt portion 91 will be referred to as a skirt length Ls hereinafter. The skirt length Ls is a dimension (a length) from the end portion of the bottom surface of the MTJ element 1 to the end portion of the bottom surface of the lower electrode 10 in a direction parallel to the substrate surface (which will be referred to as a substrate parallel direction hereinafter).

It is to be noted that a portion of the lower electrode 10 immediately below the MTJ element 1 excluding the skirt portion 91 will be referred to as a body portion (a first portion) 90 hereinafter. In the example depicted in FIG. 3 and FIG. 4A, the skirt portion 91 radially extends from a side surface of the body portion 90 and covers the side surface of the body portion 90.

Moreover, as shown in FIG. 4B, the MTJ element 1 may have a double junction structure. The MTJ element 1 having the double junction structure has a laminated structure in which a first reference layer 11A, a first intermediate layer 12A, a magnetization free layer 13, a second intermediate layer 12B and a second reference layer 11B are sequentially laminated. Such a double junction structure has an advantage that magnetization reversal of the magnetization free layer due to spin transfer can be readily controlled. Even the MTJ element 1 having the double junction structure has a tapered cross-sectional shape like the MTJ element 1 depicted in FIG. 4A, and a length Lb of a bottom surface of the MTJ element 1 (the magnetic layer 11A) is longer than a length Lt of the upper surface of the MTJ element 1 (the magnetic layer 11B).

In the following embodiment, a description will be given by using the MTJ element 1 shown in FIG. 4A.

A write operation of the MTJ element 1 based on a spin transfer write system will now be explained. A description will be given as to the parallel state (a low-resistance state) in which the magnetizing directions of the reference layer 11 and the storage layer 13 become parallel. In this case, electrons are supplied from the reference layer 11 to the storage layer 13. Majority electrons in the electrons that have passed through the reference layer 11 have spin parallel to the magnetizing direction of the reference layer 11. When spin angular momenta of the majority electrons move to the storage layer 13, a spin torque is applied to the storage layer 13, and the magnetizing direction of the storage layer 13 is adjusted to be parallel to the magnetizing direction of the reference layer 11. In this parallel arrangement, a resistance value of the MTJ element 1 becomes minimum. A situation that the magnetizing directions of the reference layer 11 and the storage layer 13 are parallel is defined as, e.g., data "0".

The antiparallel state (a high-resistance state) that the magnetizing directions of the reference layer 11 and the storage layer 13 become antiparallel will now be described. In this case, electrons are supplied from the storage layer 13 to the reference layer 11. Majority electrons in the electrons reflected by the reference layer 11 have spin that is antiparallel to the magnetizing direction of the reference layer 11. When spin angular momenta of the majority electrons move to the storage layer 13, a spin torque is applied to the storage layer 13, and the magnetizing direction of the storage layer 13 is adjusted to become antiparallel to the magnetizing direction of the reference layer 11. In this antiparallel arrangement, the resistance value of the MTJ element 1 becomes maximum. A situation that the magnetizing directions of the reference layer 11 and the storage layer 13 are antiparallel is defined as, e.g., data "1".

In the magnetoresistive random access memory according to this embodiment, the select transistor 2 is provided on the semiconductor substrate 30, and the magnetoresistive effect element (the MTJ element) 1 is provided on the lower electrode 10 above the interlayer insulating film 33. The contact plug 50A is buried in the interlayer insulating film 33. The MTJ element 1 is connected with the source/drain diffusion layer (one end of the current path) of the select transistor 2 through this contact plug 50A and the lower electrode 10.

This embodiment is characterized in that the lower electrode 10 has the tapered cross-sectional shape, one end of the lower electrode 10 is in contact with the contact plug 50A and the MTJ element 1 is arranged at the position shifted from the position immediately above the contact plug 50A.

As described above, when forming the MTJ element 1 and the lower electrode 10, the upper electrode 19 is utilized as a hard mask. The MTJ element 1 and the lower electrode 19 are formed by using the upper electrode 19 as the mask and adopting later-described oblique ion milling. As a result, the lower electrode 10 having the tapered cross-sectional shape can be formed simultaneously with forming the MTJ element 1 at a position shifted from the position immediately above the contact plug 50A in the substrate parallel direction. Therefore, performing one etching step enables forming the MTJ element 1 electrically connected with the select transistor at a position at which it does not vertically overlap the contact plug 50A. Further, the MTJ element 1 is connected with the contact plug 50A by utilizing the skirt portion 91 of the lower electrode 10 that is produced by the oblique ion milling.

It is to be noted that, as shown in FIG. 2, an interval D1a between the MTJ element 1 and the contact plug 50B in the direction parallel to the surface of the semiconductor substrate 30 is smaller than an interval D2 between the two contact plugs 50A and 50B in the direction parallel to the surface of the semiconductor substrate 30. Furthermore, an interval between the MTJ element 1 and the contact plug 51 on the plug 50B is substantially equal to the interval D1a. It is to be noted that each of the intervals D1a and D2 is a dimension between the centers of the two members.

The tapered spread of the lower electrode 10, i.e., the length (the skirt length Ls) of the skirt portion 91 of the lower electrode 10 has a correlation with respect to a film thickness of the upper electrode 19 as the hard mask.

The relationship between the film thickness of the upper electrode 19 and the skirt length Ls will now be described with reference to FIG. 5A and FIG. 5B.

Figure 5A:
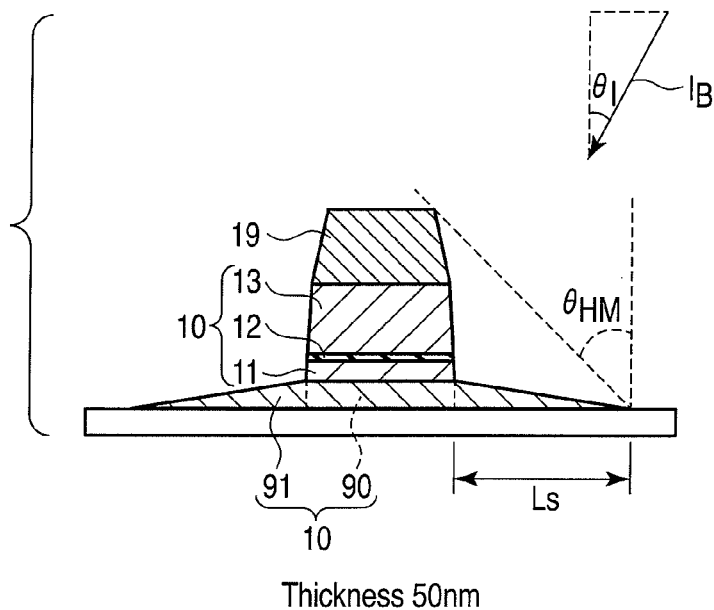
FIG. 5A is a view showing a relationship between a film thickness of a mask and a dimension of a lower electrode.
Figure 5B:
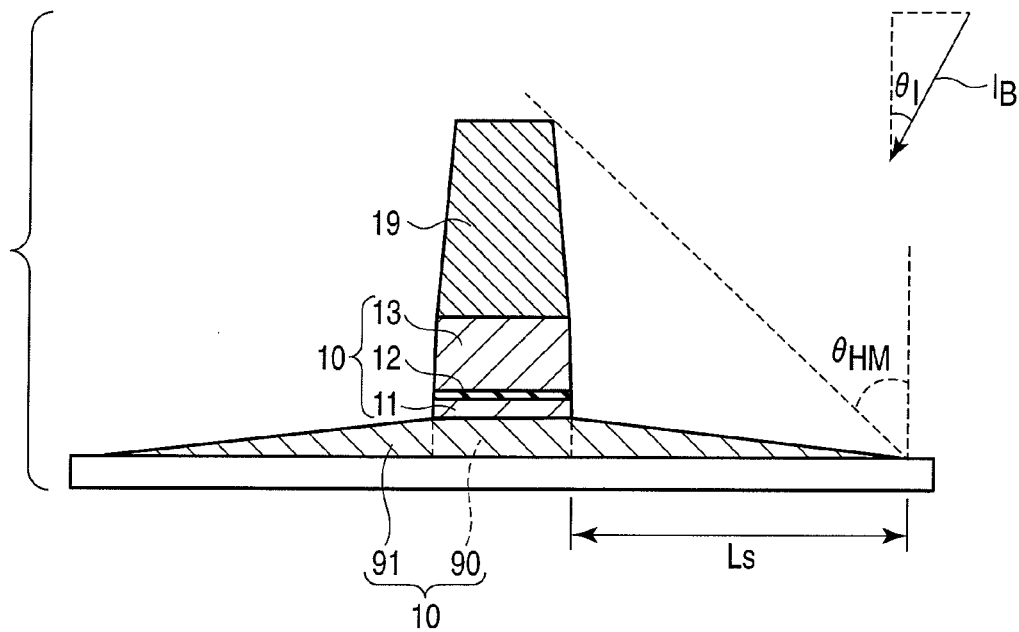
FIG. 5B is a view showing a relationship between a film thickness of the mask and a dimension of the lower electrode.

Each of FIG. 5A and FIG. 5B shows a simulation result when the MTJ element 1 and the lower electrode 10 are formed by using the upper electrode as the mask and adopting the oblique ion milling. In this embodiment, the oblique ion milling means a physical etching method of emitting an ion beam, which is applied to form the MTJ element 1, from an oblique direction with respect to a vertical direction of the semiconductor substrate (which will be referred to as a substrate vertical direction hereinafter) to have a predetermined incidence angle $θ_I$.

The film thickness of the upper electrode 19 before processing the MTJ element is set to 50 nm in FIG. 5A, and the film thickness of the upper electrode 19 before processing the MTJ element is set to 100 nm in an example of FIG. 5B. In the examples depicted in FIG. 5A and FIG. 5B, the incidence angle (which will be referred to as an ion incidence angle hereinafter) $θ_I$ of the ion beam used for the oblique ion milling is set to 45°. The ion incidence angle (a second angle) $θ_I$ is an angle formed between the direction vertical to the substrate surface and an ion beam $I_B$. A thickness of the MTJ element 1 is the same in both FIG. 5A and FIG. 5B, and it is set to, e.g., 35 nm. Moreover, the film thickness of the lower electrode 10 before processing is the same in both FIG. 5A and FIG. 5B, and it is set to, e.g., 20 nm.

Like the simulation result depicted in FIG. 5A, when the film thickness of the upper electrode (the hard mask) before processing is set to 50 nm, the skirt length Ls of the skirt portion 91 becomes approximately 0.05 µm to 0.07 µm. That is, in this case, the value that is approximately 0.05 to 0.07 µm is determined as an upper limit, and the position at which the MTJ element 1 is formed can be moved from the position immediately above the contact plug in the direction parallel to the substrate surface.

Additionally, like the simulation result depicted in FIG. 5B, when the film thickness of the upper electrode (the hard mask) before processing is set to 100 nm, the skirt length Ls of the skirt portion 91 becomes approximately 0.120 µm to 0.130 µm. In this case, the value that is approximately 0.120 µm to 0.130 µm is determined as an upper limit, and the position at which the MTJ element 1 is formed can be moved from the position immediately above the contact plug in the direction parallel to the substrate surface.

As described above, when the film thickness of the upper electrode 19 as the hard mask is increased, the skirt length Ls of the lower electrode 10 can be extended.

Further, for example, the MTJ element 1 also has the tapered cross-sectional shape. In this case, in the MTJ element 1, a dimension (a length) of the lower magnetic layer 11 in the substrate parallel direction is equal to or above a dimension (a length) of the upper magnetic layer 13 in the substrate parallel direction.

Here, an angle (a first angle) formed between a straight line connecting the end portion of the bottom surface of the lower electrode 10 (the skirt portion 91) with the end portion of the upper surface of the upper electrode 19 and the direction vertical to the substrate surface is called an angle $\theta_{HM}$. When forming the MTJ element based on the oblique ion milling, there occurs redeposition that a material arising from the magnetic layer 11 below the intermediate layer (the tunnel barrier layer) 12 and the lower electrode 10 adheres to a side surface of the intermediate layer 12 in the MTJ element 1. This redeposition becomes a cause of short circuit between the two magnetic layers 11 and 13 sandwiching the intermediate layer 12. To suppress the short circuit due to the redeposition, it is preferable for the angle $\theta_{HM}$ to be 30° or above and smaller than 90°. It is to be noted that the angle $\theta_{HM}$ has substantially the same size as the ion incidence angle $\theta_I$ of the oblique ion milling.

As described above, the skirt length Ls of the lower electrode 10 is dependent on the film thickness of the upper electrode 19 that is used as the mask for processing the MTJ element 1. Therefore, when the film thickness of the upper electrode (the hard mask) 19 is changed while considering a size (an area or a dimension of the upper surface) of the contact plug that is in contact with the lower electrode 10, the MTJ element 1 provided at the position shifted from the position immediately above the contact plug in the substrate parallel direction and the lower electrode 10 having the skirt portion 91 that is in contact with the contact plug 50A can be formed.

It is to be noted that each simulation result when the thickness of the MTJ element 1 is fixed but the film thickness of the upper electrode (the hard mask) 19 is changed is shown here, but the skirt length Ls is of course dependent on the thickness of the MTJ element 1. Like the film thickness of the upper electrode, the skirt length Ls becomes long when the thickness of the MTJ element 1 increases, and the skirt length Ls becomes short when the thickness of the MTJ element 1 decreases. When the thicknesses of the MTJ element 1 and the upper electrode (the hard mask) 19 laminated on the lower electrode 10 are adjusted in this manner, the predetermined skirt length Ls can be obtained. Furthermore, since the angle $\theta_{HM}$ is substantially the same as the ion incidence angle $\theta_I$, the skirt length Ls has the correlation with respect to the ion incidence angle, too. For example, the skirt length Ls decreases when the ion incidence angle $\theta_I$ becomes close to 0°, and the skirt length Ls increases when the angle $\theta_I$ becomes large from 0°.

As described above, in this embodiment, when the MTJ element 1 and the lower electrode 10 are processed at one step based on the oblique ion milling using the upper electrode 19 as the hard mask, the lower electrode 10 has the tapered shape and the lower electrode 10 is configured to have the skirt portion 91 as depicted in FIGS. 2 to 4A.

When this skirt portion 91 is utilized to electrically connect the MTJ element 1 with the contact plug 50A, the position of the MTJ element 1 can be shifted from the position immediately above the contact plug 50A in the substrate parallel direction so that the MTJ element 1 can be prevented from overlapping the contact plug 50A even in a case that the MTJ element 1 and the lower electrode are processed at one step.

Therefore, in particular, when the lower electrode 10 does not sufficiently function as a buffer layer, the crystallinity (e.g., a size of a crystal grain) of the contact plug 50A can be prevented from affecting the crystallinity of each magnetic layer in the MTJ element (the magnetoresistive effect element) 1.

Further, since the MTJ element 1 and the lower electrode 10 can be processed at one ion milling step as described above, the number of manufacturing steps is not increased even if the forming position of the MTJ element 1 is shifted from the position immediately above the contact plug 50A.

Therefore, according to the first embodiment, an improvement in characteristics and a decrease in manufacturing cost of the magnetoresistive random access memory can be achieved.

(b) Manufacturing Method

A manufacturing method of the magnetoresistive random access memory according to the first embodiment will now be described hereinafter with reference to FIGS. 2 to 12. FIGS. 6 to 12 show cross sections taken along the X-direction of the memory cell MC of the magnetoresistive random access memory.

Figure 6:
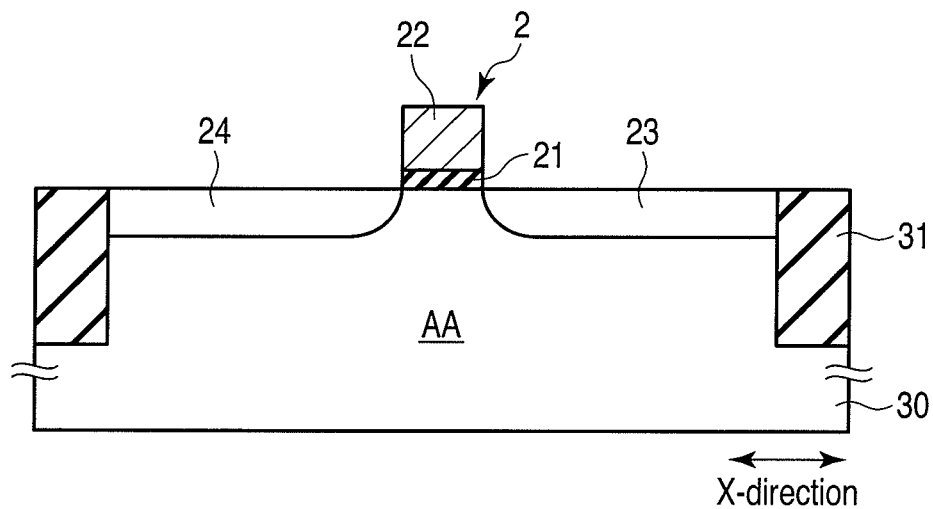
FIG. 6 is a view showing one step in a manufacturing method of the magnetoresistive random access memory according to the first embodiment.

First, as shown in FIG. 6, the element isolation insulating film 31 having, e.g., an STI (Shallow Trench Isolation) structure is buried in the semiconductor substrate 30, thereby forming an element isolating region. Forming this element isolating region partitions an element forming region AA.

Furthermore, the select transistor 2 of the memory cell MC is formed on the active region AA of the semiconductor substrate 30.

The gate insulating film 21 is formed on a surface of the element forming region AA. The gate insulating film 21 is a silicon oxide film formed by, e.g., a thermal oxidation method. Then, a conductive layer (e.g., a polysilicon layer) is formed on the gate insulating film 21 by, e.g., a CVD (Chemical Vapor Deposition) method. The conductive layer is formed into a predetermined pattern by using, e.g., a photolithography technology and an RIE (Reactive Ion Etching) method. As a result, the gate electrode 22 is formed on the gate insulating film 21. The gate electrode 22 is formed to extend in the Y-direction so that it can be used as a word line, and it is shared by the plurality of select transistors aligned in the Y-direction.

Moreover, the source/drain diffusion layers 23 and 24 are formed in the semiconductor substrate 30. The diffusion layers 23 and 24 are formed by implanting an impurity such as arsenic (As) or phosphor (P) into the semiconductor substrate 30 by an ion implanting method using the gate electrode 22 as a mask.

With the above-described steps, the select transistor 2 is formed on the semiconductor substrate 30.

Figure 7:
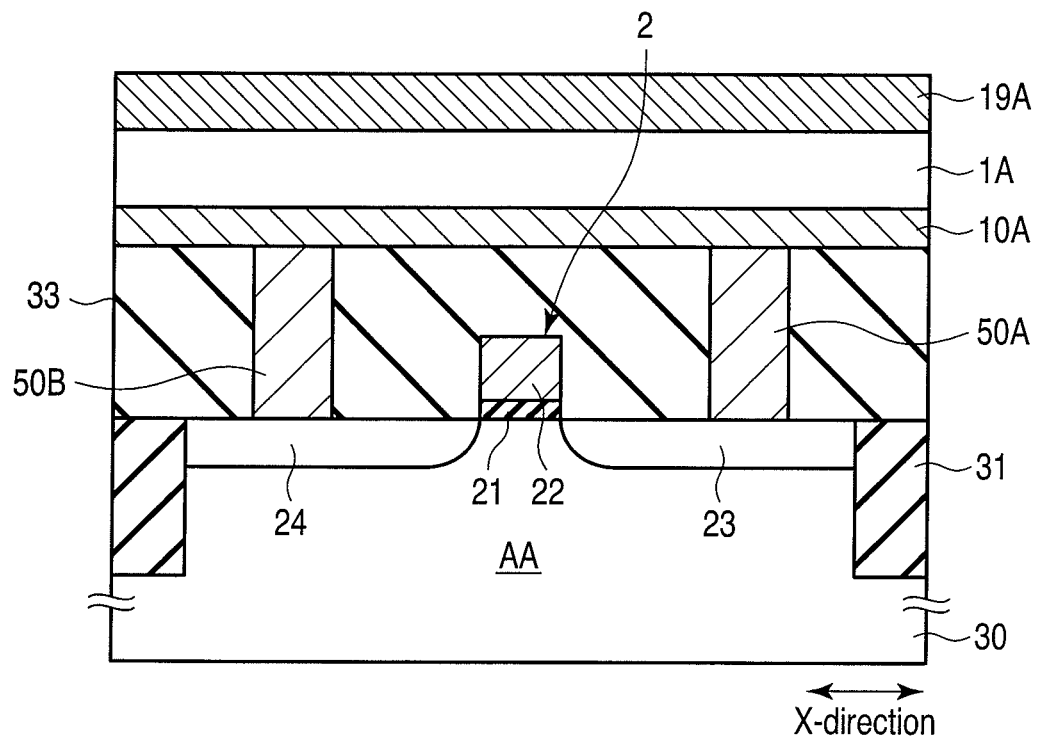
FIG. 7 is a view showing one step in the manufacturing method of the magnetoresistive random access memory according to the first embodiment.

Then, as shown in FIG. 7, the first interlayer insulating film 33 is formed on the semiconductor substrate 30 to cover the select transistor 2 by using, e.g., the CVD method. An upper surface of the interlayer insulating film 33 is flattened by using a CMP (Chemical Mechanical Polishing) method.

Additionally, a contact hole is formed in the interlayer insulating film 33 to expose upper surfaces of the source/drain diffusion layers 23 and 24. The formed contact hole is filled with, e.g., tungsten (W) or molybdenum (Mo) to form the contact plugs 50A and 50B, respectively.

A first conductive layer 10A, a laminated body 1A and a second conductive layer 19A are sequentially formed on the interlayer insulating film 33 by using, e.g., a sputtering method or the CVD method. The first conductive layer 10A serves as a lower electrode. As the first conductive layer 10A, for example, a single-layer film of titanium (Ti) or a titanium nitride (TiN) or a laminated film (Ti/TiN) of titanium and a titanium nitride is used. The laminated body 1A serves as a magnetoresistive effect element 1A. The laminated body 1A includes at least two magnetic layers and an intermediate layer (e.g., a nonmagnetic layer) sandwiched between the two magnetic layers. The second conductive layer 19A serves as a hard mask and an upper electrode. It is to be noted that, as the conductive layer 19A, a conductive material having rigidity higher than that of a film constituting the laminated body 1A or the conductive layer 10A is used to prevent the conductive layer 19A from being removed when processing the laminated body 1A.

Figure 8:
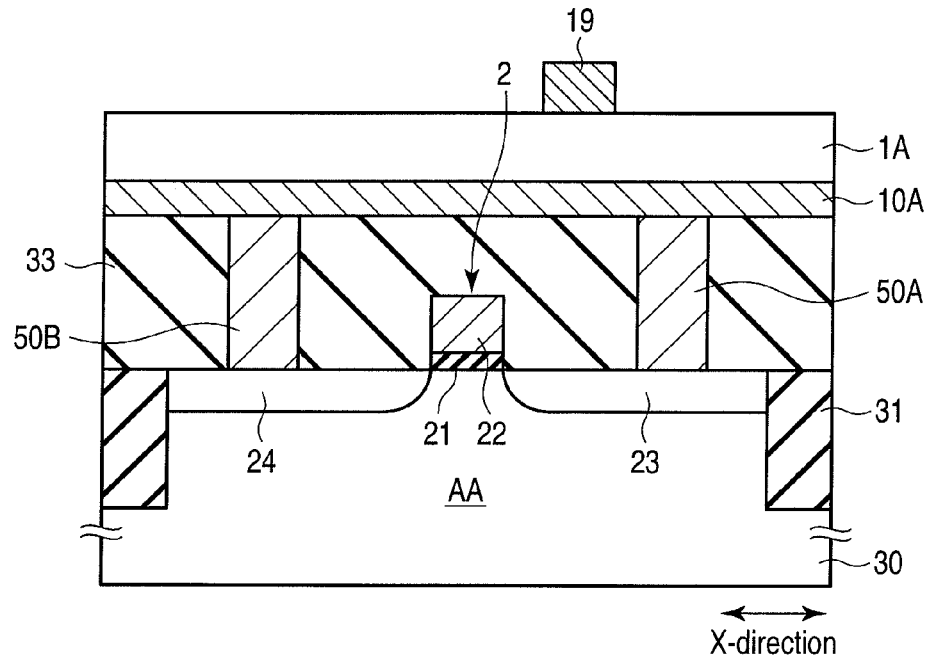
FIG. 8 is a view showing one step in the manufacturing method of the magnetoresistive random access memory according to the first embodiment.

Subsequently, as shown in FIG. 8, the conductive layer on the laminated body 1A is processed by using the photolithography technology and the RIE method. As a result, a hard mask 19 utilized to process the laminated body 1A is formed. As described above, the hard mask 19 is also used as an upper electrode. The hard mask 19 is formed at a position shifted from a position immediately above the contact plug 50A. A distance for which the hard mask 19 is shifted from the position immediately above the contact plug 50A (a dimension in the X-direction) is set in accordance with a film thickness of the hard mask 19. However, a forming position of the hard mask 19 may be set while considering, e.g., a thickness of the laminated body 1A in addition to the film thickness of the hard mask 19.

Figure 9:
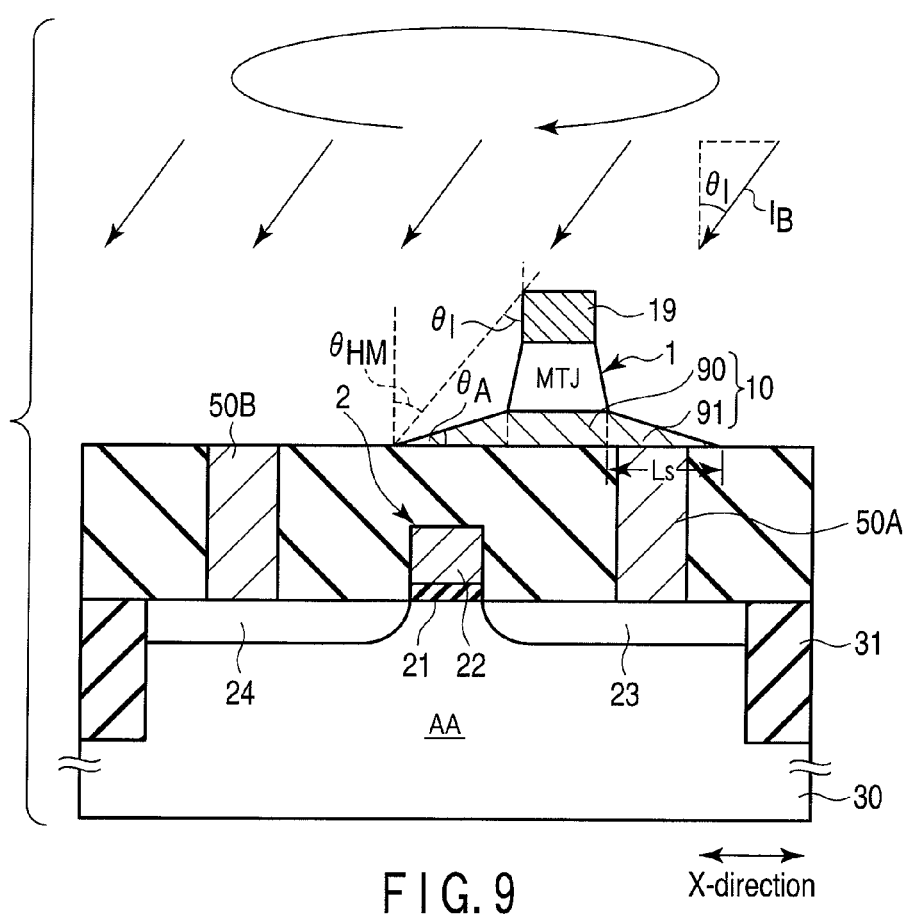
FIG. 9 is a view showing one step in the manufacturing method of the magnetoresistive random access memory according to the first embodiment.

As shown in FIG. 9, the laminated body and the conductive layer are processed, thereby forming the MTJ element 1 and the lower electrode 10. To form the MTJ element 1 and the lower electrode 10, oblique ion milling is used. Ions used for ion milling is, e.g., argon (Ar). An ion beam $I_B$ is applied in such a manner that its ion incidence angle $\theta_I$ becomes an oblique direction with respect to the semiconductor substrate surface. As described above, the ion incidence angle $\theta_I$ is an angle formed between a direction vertical to the substrate surface and an incidence direction of the ion beam $I_B$. The ion incidence angle $\theta_I$ is set by inclining the substrate 30.

When forming the MTJ element 1 based on the oblique ion milling, the ion milling is executed in a state that the semiconductor substrate 30 is rotated.

When forming the MTJ element 1 based on the oblique ion milling, a material (a conductive material) produced from the magnetic layer below the intermediate layer and the lower electrode 10 adheres to a side surface of the intermediate layer of the MTJ element 1 by redeposition of the processed member, and the member having this material attached thereto becomes a cause of short circuit between the magnetic layers in the MTJ element 1. Therefore, to suppress the redeposition by increasing a lateral component of etching using the ion beam, it is preferable for the ion incidence angle $\theta_I$ to be 30° or above and to be smaller than 90°. It is to be noted that setting the ion incidence angle $\theta_I$ to approximately 30° is preferable, but it is not restricted to this value.

Further, when the MTJ element 1 and the lower electrode 10 are formed by using the oblique ion milling while rotating the substrate 30, each of the MTJ element 1 and the lower electrode 10 has a circular plane shape as shown in FIG. 3.

The MTJ element 1 is formed immediately below the hard mask 19. As described above, since the hard mask 19 is formed at the position shifted from the position immediately above the contact plug 50A in the substrate parallel direction, the MTJ element 1 is also formed at the position shifted from the position immediately above the contact plug 50A in the substrate parallel direction. A cross-sectional structure of the MTJ element 1 has, e.g., a tapered shape based on processing using the oblique ion milling as depicted in FIG. 4A.

A cross-sectional structure of the lower electrode 10 has, e.g., a tapered shape based on the oblique ion milling and a length L of a bottom surface thereof is longer than a length Lb of an upper surface of the same as depicted in FIG. 4A. An angle formed by a side surface of the lower electrode 10 with respect to the bottom surface of the lower electrode 10 is an acute angle, and the lower electrode 10 has a predetermined tapered angle $\theta_A$. The lower electrode 10 is formed of the body portion 90 immediately below the MTJ element 1 and the skirt portion 91 on the side surface of the body portion 90. The skirt portion (the tapered shape) 91 is generated when a region that is hidden behind the mask 19 and the laminated body (the MTJ element 1) with respect to an irradiating direction of the ion beam $I_B$ is generated due to rotation of the semiconductor substrate 30 and an etching rate of the member in this region becomes lower than an etching rate of the member in a region irradiated with the ion beam.

The skirt portion 91 has the predetermined skirt length Ls. This skirt portion 91 is formed on the contact plug 50A. The body portion 90 of the lower electrode 10 is not in contact with the contact plug 50A. For example, in the formed MTJ element 1 and the lower/upper electrodes 10 and 19, the angle $\theta_{HM}$ formed between the straight line connecting the end portion of the bottom surface of the lower electrode 10 (the skirt portion 91) to the end portion of the upper surface of the upper electrode 19 and the substrate vertical direction has substantially the same value as the ion incidence angle $\theta_I$.

As described in conjunction with FIGS. 5A and 5B as an example, the skirt length Ls of the lower electrode 10 has the correlation with the thicknesses of the upper electrode 19 and the MTJ element 1. Therefore, adjusting the thicknesses of the upper electrode 19 and the MTJ element 1 enables shifting the forming position of the MTJ element 1 from the position immediately above the contact plug 50A in the substrate parallel direction in the range of the skirt length Ls. The electrical connection between the MTJ element 1 and the contact plug 50A is assured by the skirt portion 90 formed based on the oblique ion milling.

Moreover, the processing of the MTJ element 1 and the processing of the lower electrode 10 are simultaneously executed at one processing step (the oblique ion milling) using the same hard mask (the upper electrode) 19.

After the MTJ element 1 and the lower electrode 10 are formed, the second interlayer insulating film 34 is deposited on the interlayer insulating film 33 as depicted in FIG. 10. The contact hole is formed in the interlayer insulating film 34 above the contact plug 50B. Additionally, a metal is buried in the formed contact hole, and the via plug 51 is formed in the second interlayer insulating film 34.

Further, a metal film of, e.g., aluminum (Al) or copper (Cu) is deposited on the interlayer insulating film 34 by using, e.g., the sputtering method. The deposited metal film is processed by using the photolithography technology and the RIE method. As a result, an intermediate interconnect 52A is formed on the upper electrode 19. Furthermore, the interconnect 52B is formed on the via plug 51. The interconnect 52B is, e.g., the second bit line bBL.

Thereafter, as shown in FIG. 2, the third interlayer insulating film 35 is deposited on the interlayer insulating film 34 by using, e.g., the CVD method. The contact hole is formed in the interlayer insulating film 35 on the intermediate interconnect 52A. The via plug 53 is buried in this contact hole.

Moreover, the first bit line BL is formed on the interlayer insulating film 35. The first bit line BL is electrically connected with the MTJ element 1 through the via plug 53, the interconnect 52A and the upper electrode 19.

With the above-described steps, the magnetoresistive random access memory according to this embodiment is brought to completion.

As described with reference to FIGS. 2 to 10, in the manufacturing method of the magnetoresistive random access memory according to the first embodiment, the upper electrode 19 is used as a mask utilized to form the MTJ element 1 and the lower electrode 10. The upper electrode 19 as the hard mask is formed at the position shifted from the position immediately above the contact plug 50 in the substrate parallel direction. Additionally, the member is processed based on the oblique ion milling while rotating the substrate, and the MTJ element 1 and the lower electrode 10 are formed with the upper electrode 19 as a mask.

As a result, the MTJ element 1 is formed at the position shifted from the position above (immediately above) the contact plug 50A in the substrate parallel direction. Therefore, even if the lower electrode 10 cannot buffer a difference in crystal structure between the MTJ element 1 and the contact plug 50A, the MTJ element can be formed without adverse affect of the crystallinity (e.g., a size of a crystal grain) of the metal constituting the contact plug 50A on the magnetic layers of the MTJ element. Therefore, in this embodiment, characteristics of the MTJ element 1 can be improved.

Further, the lower electrode 10 formed based on the oblique ion milling has the tapered cross-sectional shape, and the skirt portion 91 having the predetermined skirt length Ls is formed on the side surface of the body portion 90 of the lower electrode 10 immediately below the MTJ element 1. The skirt portion 91 is formed to extend to the contact plug 50A side from the side surface of the body portion 90 and come into contact with the upper surface of the contact plug 50A.

When the lower electrode 10 having the skirt portion 91 is formed by using the oblique ion milling while rotating the substrate, the MTJ element formed at the position shifted from the position immediately above the contact plug 50A can be electrically connected with the contact plug 50A by using the skirt portion 91.

Therefore, the MTJ element and the lower electrode 10 can be simultaneously formed by the processing (the oblique ion milling) using the one hard mask (the upper electrode) 19 even though the forming position of the MTJ element 1 is shifted from the position immediately above the contact plug 50A.

Therefore, in this embodiment, characteristics of the MTJ element can be improved without increasing the number of manufacturing steps, and a manufacturing cost of the magnetoresistive random access memory is not increased either.

Thus, according to the manufacturing method of the first embodiment, the magnetoresistive random access memory achieving the improvement in characteristics and the reduction in manufacturing cost can be provided.

(2) Second Embodiment

A magnetoresistive random access memory and a manufacturing method thereof according to a second embodiment will now be described hereinafter with reference to FIGS. 11 to 13. It is to be noted that, in the second embodiment, like reference numerals denote constituent elements equal to those in the first embodiment, and detailed description thereof will be given as required.

(a) Configuration

A configuration of a magnetoresistive random access memory according to the second embodiment will now be described with reference to FIG. 11. Here, a difference from the first embodiment will be mainly explained.

As shown in FIG. 11, an MTJ element 1 according to this embodiment is arranged on an interlayer insulating film 33 to be shifted in an opposite direction of a second contact plug 50B (a second bit line bBL) side in an opposite direction. For example, the magnetoresistive effect element 1 is arranged above an element isolation insulating film 31 or above a region (a diffusion layer 23) between a contact plug 50A and the element isolation insulating film 31 through a lower electrode 10B and the interlayer insulating film 33.

As shown in FIG. 11, an interval D1b between the MTJ element 1 and the contact plug 50B or the plug 51 in a direction parallel to a surface of a semiconductor substrate 30 is larger than an interval D2 between the two contact plugs 50A and 50B in the direction parallel to the surface of the semiconductor substrate 30. An interval between the MTJ element 1 and the contact plug 51 on the contact plug 50B is substantially equal to the interval D1b.

Therefore, an interval D1b between a via plug 51 (a bit line bBL) and the MTJ element increases. When the interval between the MTJ element and an interconnect adjacent to each other increases in this manner, an interference like a parasitic capacitance produced between the second bit line bBL and the MTJ element 1 can be reduced at the time of driving the magnetoresistive random access memory.

Therefore, the magnetoresistive random access memory according to this embodiment can stably drive the MTJ element 1 and a memory cell. In particular, since miniaturization of the memory cell has been pushed, a the large interval between the MTJ element 1 and the interconnect adjacent to each other is assured by shifting the MTJ element 1 to the opposite side of the second bit line side, and an effect of suppressing the interference between the MT element and the interconnect adjacent to each other is considerable.

Moreover, when the MTJ element 1 is shifted to the opposite side of the second bit line side, a skirt portion 91 and the via/contact plugs 50B and 51 can be prevent from coming into contact with each other due to a processing defect of a lower electrode 10 arising from unevenness in processes, thereby avoiding short circuit between the MTJ element 1 and the interconnect.

Additionally, in this embodiment, a skirt portion of the lower electrode 10B on an opposite side (a right-hand side in FIG. 11) of the second contact plug 50B side is removed with the MTJ element 1 at the center. That is, in this embodiment, a body portion 90 of the lower electrode 10B has a skirt portion 91 that is in contact with the first contact plug 50A on the second contact plug 50B side, and a side surface of the body portion 90 is exposed on an opposite side of the second contact plug 50B side.

When the skirt portion that is not in contact with the contact plug 50A in a lower layer is removed from the lower electrode 10B as described above, the spread of the skirt portion 91 can be prevented from increasing a size of the memory cell.

As described above, according to the second embodiment, like the example described in conjunction with the first embodiment, characteristics of the element constituting the magnetoresistive random access memory can be improved. In addition, the magnetoresistive random access memory according to the second embodiment can contribute to stabilization of a memory operation and a reduction in area occupied by the memory cell.

(b) Manufacturing Method

A manufacturing method of the magnetoresistive random access memory according to the second embodiment will now be described with reference to FIGS. 11 to 13. Here, the detailed description of the same steps as those in the manufacturing method described in the first embodiment will be omitted.

As shown in FIG. 12, like the manufacturing method described in the first embodiment, a select transistor 2 is formed on a semiconductor substrate (an active region) 30. The interlayer insulating film 33 is deposited on the semiconductor substrate 30 to cover the select transistor 2. Further, the contact plugs 50A and 50B are buried in the interlayer insulating film 33 to come into contact with diffusion layers 23 and 24 of the select transistor 2.

A conductive layer serving as the lower electrode, a laminated body serving as the MTJ element 1 and a conductive layer serving as the upper electrode are sequentially deposited on the interlayer insulating film 33. The upper electrode 19 as a hard mask is formed by using a photolithography technology and an RIE method. The upper electrode 19 is formed at a position shifted from a position above the contact plug 50A in a substrate parallel direction. In this embodiment, the upper electrode 19 is formed to be shifted from the position immediately above the contact plug 50A on the opposite side of the contact plug 50B side.

Furthermore, like the first embodiment, the MTJ element 1 and the lower electrode 10 are formed by using the upper electrode 19 as a mask based on oblique ion milling while rotating the substrate.

Since the upper electrode 19 as the hard mask is formed at the position shifted to the opposite side of the contact plug 50B side in the substrate parallel direction, the MTJ element 1 formed below the upper electrode 19 is also formed at a position shifted to the opposite side of the contact plug 50B side.

Moreover, the tapered lower electrode 10 having the skirt portion 91 is formed based on the oblique ion milling, and the skirt portion 91 on the contact plug 50B side comes into contact with the upper surface of the contact plug 50A.

Then, as shown in FIG. 13, the skirt portion on the side where it is not in contact with the contact plug 50A is removed. The skirt portion is removed by using the oblique ion milling like the processing of the MTJ element 1. However, at this step, an ion beam having a fixed ion inclination angle $\theta_I$ is applied to the side surface of the MTJ element 1 and the side surface of the lower electrode 10 from a predetermined direction without rotating the semiconductor substrate 30.

An ion beam irradiating direction is set in such a manner that ions do not collide with the skirt portion 91 on the side where it is in contact with the contact plug 50A. That is, a direction of the substrate 30 with respect to the ion beam irradiating direction is set in such a manner that the skirt portion 91 that is in contact with the contact plug 50A is hidden behind the MTJ element 1 with respect to the irradiating direction of the ion beam $I_B$.

As a result, the skirt portion on the opposite side of the contact plug 50B side is removed. Therefore, in the lower electrode 10B, the side surface of the body portion 90 is exposed on the opposite side of the contact plug 50 side.

It is to be noted that, when the oblique ion milling is executed with rotation of the substrate being stopped, the side surface that is irradiated with the ion beam is also etched in the MTJ element 1. Therefore, the cross-sectional shape of the MTJ element 1 has different tapered angle depending on the side of the lower electrode 10B where the side surface of the body portion 90 is exposed (the side where the skirt portion is removed) and the side of the same where the side surface of the body portion 90 is not exposed (the side where the skirt portion remains). Therefore, the planar shape of each of the MTJ element 1 and the lower electrode 10B also differs depending on the side where the skirt portion is removed and the side where the skirt portion remains.

Thereafter, as shown in FIG. 11, like the step described in conjunction with the first embodiment, interlayer insulating films 34 and 35, the via plugs 51 and 53 and interconnects 52A, 52B and BL are formed, respectively.

With the above-described steps, the magnetoresistive random access memory according to this embodiment is brought to completion.

In the manufacturing method of the magnetoresistive random access memory according to the second embodiment, like the manufacturing method described in the first embodiment, the MTJ element 1 is formed at the position shifted from the position above the contact plug 50A in the substrate parallel direction. Therefore, in this embodiment, the MTJ element 1 can be formed without being affected by crystallinity of the contact plug like the first embodiment.

Further, the oblique ion milling is utilized to form the lower electrode 10 having the skirt portion 91 simultaneously with formation of the MTJ element 1, and the MTJ element 1 formed at the position shifted from the position immediately above the contact plug 50A is connected with the contact plug 50A by utilizing the skirt portion 91. Therefore, even in the configuration where the MTJ element is formed at the position shifted from the position above the contact plug, one mask (the upper electrode) 19 can be utilized to simultaneously process the MTJ element and the lower electrode. Accordingly, even in this embodiment, characteristics of the MTJ element can be improved without increasing the number of manufacturing steps like the first embodiment.

In this embodiment, the MTJ element 1 is formed to be shifted from the position immediately above the first contact plug 50A on the opposite side of the second contact plug 50B (the second bit line) side in the substrate parallel direction. As a result, a large interval between the MTJ element 1 and the interconnect adjacent to each other can be assured, and mutual interference between the MTJ element and the interconnect adjacent to each other can be reduced. Therefore, according to the manufacturing method described in this embodiment, the MTJ element 1 and the memory cell each having the stabilized operation can be provided, thereby improving reliability of the magnetoresistive random access memory.

Furthermore, in the manufacturing method according to this embodiment, when the skirt portion on the side where it is not in contact with the contact plug 50A is removed, the magnetoresistive random access memory in which an increase in area of the memory cell due to the skirt portion 91 of the lower electrode 10B is suppressed can be provided.

Moreover, in the manufacturing method according to the present embodiment, at the step of removing the skirt portion on the side where it is not in contact with the contact plug 50A, it is good enough to stop rotation of the semiconductor substrate (a direction of the semiconductor substrate) so that the skirt portion 91 that is in contact with the contact plug 50A can be hidden behind the MTJ element with respect to the ion beam irradiation side, and the number of manufacturing steps is not substantially increased.

Therefore, according to the manufacturing method of the second embodiment, the magnetoresistive random access memory achieving the improvement in characteristics and the reduction in manufacturing cost can be provided. Additionally, according to the manufacturing method of the second embodiment, the magnetoresistive random access memory that can contribute to stabilization of operations and a reduction in area (a chip size) can be provided.

It is to be noted that, in the magnetoresistive random access memory according to the first embodiment depicted in FIG. 2, like the method described in the second embodiment, the configuration in which the skirt portion that is not in contact with the contact plug 50A is removed can be of course adopted.

[Modification]

A magnetoresistive random access memory according to a modification of the embodiment will now be described with reference to FIG. 14. Like reference numerals denote constituent elements equal to those in the first and second embodiments, and a detailed description thereof will be given as required.

In this modification, as shown in FIG. 14, an MTJ element 1 is provided on a second interlayer insulating film 34. In the first and second embodiments, the MTJ element 1 is provided on an interconnect level that is one layer above the select transistor 2, and the one plug 50A is utilized to connect the MTJ element 1 to the source/drain diffusion layer 23 of the select transistor 2. On the other hand, in this modification, the MTJ element 1 is provided on an interconnect level that is two layers above a select transistor 2, and two plugs 50A and 53 and an intermediate interconnect 52A are utilized to connect the MTJ element 1 to a source/drain diffusion layer 23 of the select transistor 2.

Even in case of the plug 53 other than the contact plug 50A that is directly in contact with the source/drain diffusion layer 23 of the select transistor 2, each magnetic layer of the MTJ element 1 may be possibly adversely affected by crystallinity of the plug 53 to degrade characteristics of the MTJ element 1 when the MTJ element 1 is provided immediately above the plug 53. Thus, in this modification, like the first and second embodiments, a skirt portion 91 of a lower electrode 10 is utilized to shift a forming position of the MTJ element 1 from a position immediately above the plug 53 in a substrate parallel direction. As a result, like the first and second embodiments, the degradation in element characteristics of the MTJ element 1 can be suppressed.

Furthermore, in this case, the MTJ element 1 and the lower electrode 10 are simultaneously processed with the an upper electrode 19 being used as a hard mask based on oblique ion milling while rotating a semiconductor substrate 30. That is, the MTJ element 1 and the lower electrode 10 do not have to be processed at different steps. Therefore, even in case of the magnetoresistive random access memory depicted in FIG. 14, the number of manufacturing steps and a manufacturing cost thereof are not increased.

It is to be noted that FIG. 14 shows an example that the MTJ element 1 is shifted toward the contact plug 50B side, but the MTJ element 1 can be of course shifted to an opposite side of the contact plug 50B side in the substrate parallel direction. Moreover, in the lower electrode 10, the skirt portion on the side where it is not in contact with a via plug 53 can be of course removed.

As described above, even the magnetoresistive random access memory according to the modification depicted in FIG. 14 can obtain the same effect as that described in the first and second embodiments and improve characteristics of a magnetoresistive effect element used for the magnetoresistive random access memory.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory comprising:
a select transistor comprising first and second diffusion layers in a semiconductor substrate, a gate insulating film on a surface of the semiconductor substrate between the first and second diffusion layers, and a gate electrode on the gate insulating film, the select transistor covered with a first interlayer insulating film on the semiconductor substrate;
first and second contact plugs in the first interlayer insulating film, the first contact plug electrically connected to the first diffusion layer, and the second contact plug electrically connected to the second diffusion layer;
a lower electrode on the first interlayer insulating film;
a magnetoresistive effect element on the lower electrode, the magnetoresistive effect element comprising a first magnetic layer having an invariable magnetizing direction, a second magnetic layer having a variable magnetizing direction, and an intermediate layer between the first and second magnetic layers;
an upper electrode on the magnetoresistive effect element;
a first bit line electrically connected to the upper electrode; and
a second bit line electrically connected to the second contact plug,
wherein the lower electrode has a tapered cross-sectional shape in which a dimension of a bottom surface of the lower electrode is larger than a dimension of an upper surface of the lower electrode,
wherein the magnetoresistive effect element is provided at a position shifted from a position immediately above the first contact plug in a direction parallel to a surface of the semiconductor substrate, the shifted position of the magnetoresistive effect element is on an opposite side of the second contact plug side in a direction in which the first and second contacts plugs are arranged,
wherein the lower electrode includes a first portion provided immediately below the magnetoresistive effect element, and a second portion extending toward the first contact plug from the first portion,
wherein the first portion is not in direct contact with the first contact plug, the first portion includes a first side surface on the second contact plug side and a second side surface facing the first side surface, the second side surface is in contact with a second interlayer insulating film that covers the magnetoresistive effect element,
wherein the second portion is in contact with an upper surface of the first contact plug, the second portion that is in contact with the upper surface of the first contact plug is provided on the first side surface, and
wherein the second portion has a tapered angle formed between an inclined side surface of the second portion and a bottom surface of the second portion, the second portion has a predetermined length to connect the first portion to the first contact plug,
wherein the inclined side surface of the second portion is inclined in a whole region between a top side of the lower electrode and a bottom side of the lower electrode.

2. The magnetoresistive memory of claim 1, wherein a distance between the second contact plug and the magnetoresistive effect element in a direction parallel to the surface of the semiconductor substrate is larger than a distance between the first contact plug and the second contact plug in a direction parallel to the surface of the semiconductor substrate.

3. The magnetoresistive memory of claim 1, wherein a distance between the second contact plug and the magnetoresistive effect element in a direction parallel to the surface of the semiconductor substrate is smaller than a distance between the first contact plug and the second contact plug in a direction parallel to the surface of the semiconductor substrate.

4. The magnetoresistive memory of claim 1, further comprising:

a third contact plug that is provided on the second contact plug and adjacent to the magnetoresistive effect element, wherein a distance between the third contact plug and the magnetoresistive effect element in a direction parallel to the surface of the semiconductor substrate is larger than a distance between the first contact plug and the second contact plug in the direction parallel to the surface of the semiconductor substrate.

5. The magnetoresistive memory of claim 1, wherein the magnetoresistive effect element has a tapered cross-sectional shape, and a dimension of a bottom surface of the magnetoresistive effect element is larger than a dimension of an upper surface of the magnetoresistive effect element.

6. The magnetoresistive memory of claim 1, wherein an angle formed between a straight line connecting an end portion of a bottom surface of the lower electrode with an end portion of an upper surface of the upper electrode and a direction vertical to the surface of the semiconductor substrate is greater than or equal to 30° and less than 90°.

* * * * *

UNITED STATES PATENT AND TRADEMARK OFFICE
CERTIFICATE OF CORRECTION

| | | |
|---|---|---|
| PATENT NO. | : 8,829,580 B2 | Page 1 of 1 |
| APPLICATION NO. | : 12/854724 | |
| DATED | : September 9, 2014 | |
| INVENTOR(S) | : Kuniaki Sugiura | |

It is certified that error appears in the above-identified patent and that said Letters Patent is hereby corrected as shown below:

On the title page, item 54 and in the specification, in Column 1, line 2, in Title, after "METHOD" insert --THEREOF--.

Signed and Sealed this
Eighth Day of December, 2015

Michelle K. Lee
*Director of the United States Patent and Trademark Office*